(12) United States Patent
Burke, Jr. et al.

(10) Patent No.: US 7,587,642 B2
(45) Date of Patent: Sep. 8, 2009

(54) SYSTEM AND METHOD FOR PERFORMING CONCURRENT MIXED SIGNAL TESTING ON A SINGLE PROCESSOR

(75) Inventors: Dennis Harold Burke, Jr., Allen, TX (US); Mark Allen Erickson, Richardson, TX (US); Kevin Dale Bittick, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1103 days.

(21) Appl. No.: 10/614,997

(22) Filed: Jul. 8, 2003

(65) Prior Publication Data

US 2005/0010842 A1    Jan. 13, 2005

(51) Int. Cl.
*G01R 31/28* (2006.01)
*G01R 27/28* (2006.01)

(52) U.S. Cl. ...................... 714/724; 702/118
(58) Field of Classification Search ......... 714/724–725, 714/733–734, 10, 11, 30, 38, 742, 740, 776; 702/118; 716/4
See application file for complete search history.

(56) References Cited

U.S. PATENT DOCUMENTS

| | | | | |
|---|---|---|---|---|
| 4,145,733 A * | 3/1979 | Misunas et al. | ............. | 718/106 |
| 4,672,534 A * | 6/1987 | Kamiya | ........................ | 714/30 |
| 6,300,772 B1 | 10/2001 | Brown et al. | ................ | 324/555 |
| 6,331,770 B1 * | 12/2001 | Sugamori | ................ | 324/158.1 |
| 6,345,242 B1 * | 2/2002 | Dearth et al. | ................. | 703/22 |
| 6,536,006 B1 * | 3/2003 | Sugamori | ................... | 714/724 |
| 6,574,760 B1 | 6/2003 | Mydill | | |
| 6,618,853 B1 * | 9/2003 | Ohyama et al. | ............. | 717/109 |
| 6,625,557 B1 * | 9/2003 | Perkins et al. | .............. | 702/117 |
| 6,629,282 B1 * | 9/2003 | Sugamori et al. | ........... | 714/734 |
| 6,681,351 B1 * | 1/2004 | Kittross et al. | .............. | 714/724 |
| 6,745,146 B1 * | 6/2004 | Brown et al. | ................. | 702/123 |
| 6,868,508 B2 * | 3/2005 | Grey | ........................... | 714/25 |
| 6,900,627 B2 * | 5/2005 | Mori et al. | ................ | 324/158.1 |
| 6,920,585 B1 * | 7/2005 | Fintel et al. | .................. | 714/43 |
| 7,089,534 B2 * | 8/2006 | Hartman et al. | ............. | 717/125 |
| 2003/0154047 A1 * | 8/2003 | Chun et al. | ................. | 702/118 |
| 2003/0237025 A1 * | 12/2003 | Song | .......................... | 714/30 |

FOREIGN PATENT DOCUMENTS

JP    2123442    * 11/1988

* cited by examiner

*Primary Examiner*—Phung M Chung
(74) *Attorney, Agent, or Firm*—Yingsheng Tung; Wade J Brady, III; Frederick J. Telecky, Jr.

(57) ABSTRACT

The present application describes a system and method for testing semiconductor devices and specifically for testing mixed signal semiconductor devices. The test systems are configured to test the semiconductor devices using overlapping test setups by configuring various test system elements. The various test system elements are programmed and prepared for subsequent tests concurrently with tests executing on the semiconductor devices. The test results are computed by various software computation modules configured to independently execute in parallel with the subsequent tests. The resultant test data of an executed test is shared among the various concurrently executing software computation modules using shared information storage. A tester user interface, executing on test system, provides an interface between user test scripts and software computation modules. Therefore, separating complex computations and data compilation from test execution in the test system results in significantly faster and efficient semiconductor device testing.

18 Claims, 3 Drawing Sheets

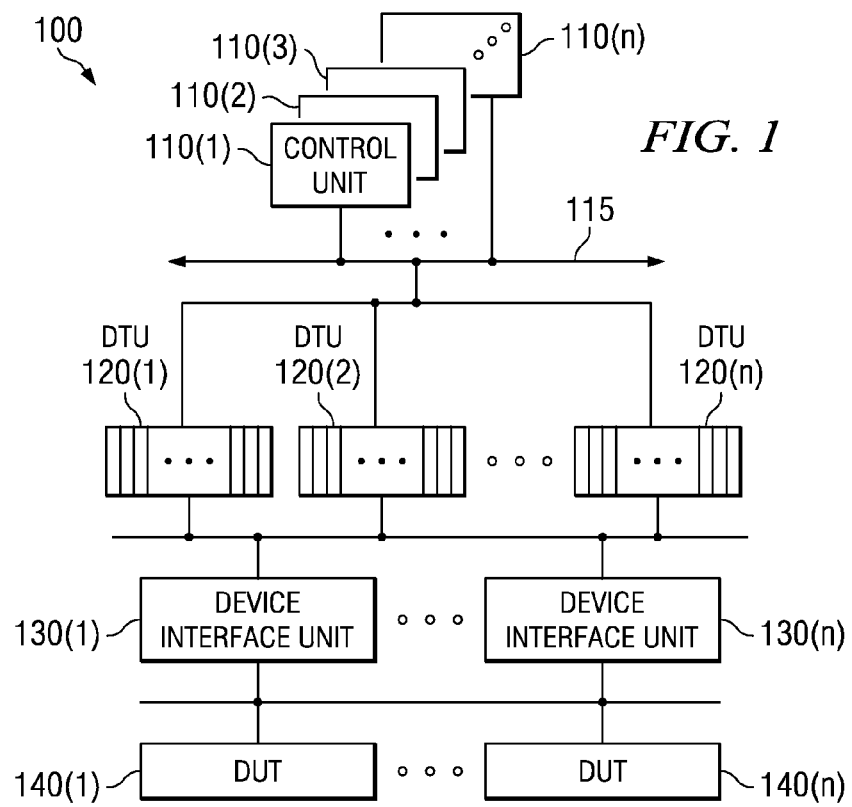
FIG. 1
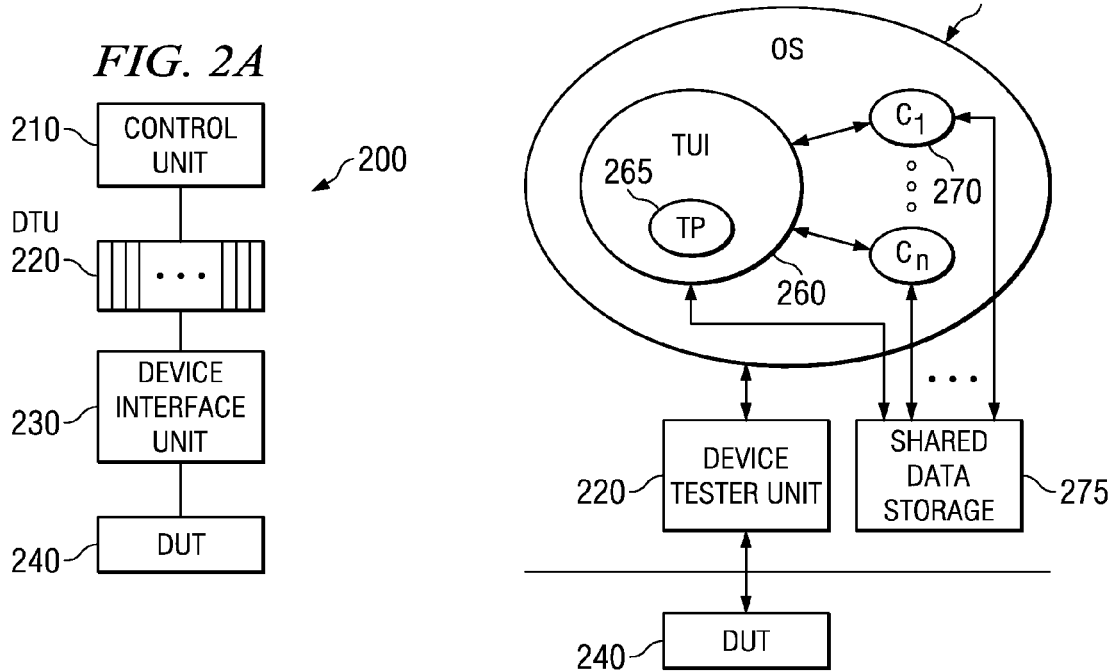
FIG. 2A
FIG. 2B

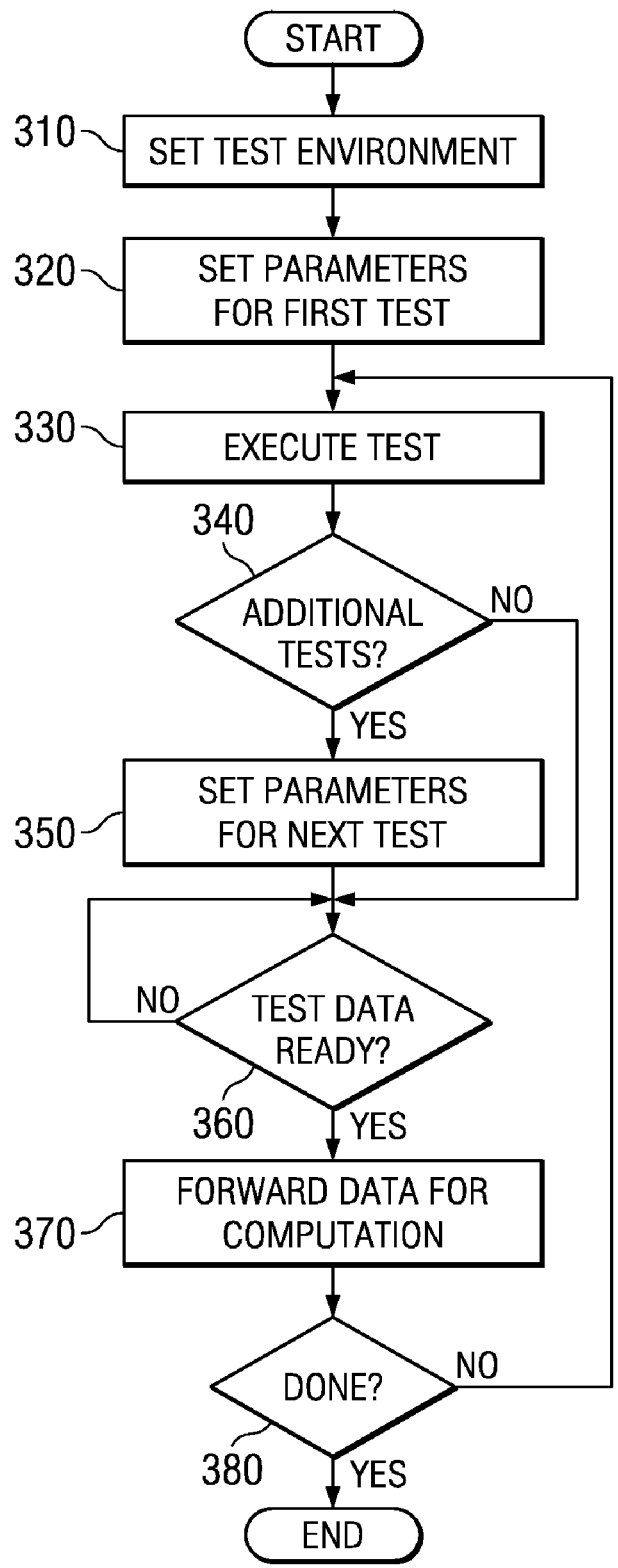

SYSTEM AND METHOD FOR PERFORMING CONCURRENT MIXED SIGNAL TESTING ON A SINGLE PROCESSOR

TECHNICAL FIELD

Embodiments described in this application relate to semiconductor device testing and more specifically to mixed signal semiconductor device testing.

BACKGROUND

Generally, a major portion of the cost of semiconductor integrated devices includes the cost of testing the devices. The cost of testing the devices increases exponentially with various stages of assembly process. Thus, it is advantageous to test the devices earlier in the assembly process. The analog and mixed signal devices are generally tested to confirm functionality but the testing consumes a significant amount of time. A method and system for testing semiconductor devices are described in a commonly owned U.S. Application entitled "Testing Method and Apparatus Assuring Semiconductor Device Quality and Reliability," Ser. No. 09/413,926, filed Oct. 7, 1999. This application is incorporated herein by reference in its entirety for all purposes. For mixed signal testing, substantial test time is consumed in performing Fast Fourier Transforms (FFT), performing other computations, and evaluating the results of the test based on these calculations. The time delay becomes more prominent during multi-site testing of mixed signal testing.

SUMMARY

The present application describes a system and method for testing semiconductor devices and specifically for testing mixed signal semiconductor devices. The test systems are configured to test the semiconductor devices using overlapping test setups by configuring various test system elements. The various test system elements are programmed and prepared for subsequent tests concurrently with tests executing on the semiconductor devices. The test results are computed by various software computation modules configured to independently execute in parallel with the subsequent tests. The resultant test data of an executed test is shared among the various concurrently executing software computation modules using shared information storage. Test system software provides an interface between device test program and software computation modules. Thus, separating complex computations and data compilation from test execution in the test system, results in significantly faster and efficient semiconductor device testing.

In some embodiments, a method of testing at least one mixed signal semiconductor device is described. The method includes executing a first test for the at least one mixed signal semiconductor device, preparing execution of a second test for the at least one mixed signal semiconductor device concurrently with the executing of the first test, processing test data resulting from the first test, and executing the second test concurrently with the processing of the test data. In some variations, the mixed signal semiconductor testing is performed by a single processor. In some embodiments, the executing the first test comprises configuring hardware device elements corresponding to the first test in a mixed signal semiconductor device tester unit, and executing one or more test scripts corresponding to the first test wherein in some variations, the one or more test scripts include at least one command executable on the processor and in some other variations, the mixed signal semiconductor device tester unit is coupled to the processor.

In some embodiments, the preparing execution of the second test includes identifying hardware elements corresponding to the second test, and configuring the hardware elements corresponding to the second test. In some variations, the first and the second tests are configured for one or more of wafer testing and package testing of the mixed signal semiconductor device. In some variations, the first and second tests are configured in an interpreted software language. In some embodiments, the interpreted software language is Interactive Test Pascal. In some variations, the method includes storing the test data resulting from the first test in a first information storage. In some embodiments, the first information storage is shared by a plurality of software computation modules concurrently executing on the processor. In some variations, the plurality of software computation modules are configured in at least one compiled software language. In some embodiments, the method includes storing results of the processing of the test data in a second information storage. In some variations, the second information storage is shared by the plurality of software computation modules. In some embodiments, the first and second information storage are configured in a single storage unit.

In some embodiments, an apparatus for testing at least one mixed signal semiconductor devices is described. In some variations, the apparatus includes, at least one processor, and at least one device tester unit coupled to the processor. In some embodiments, the processor is configured to execute a first test for the at least one mixed signal semiconductor device, prepare execution of a second test for the at least one mixed signal semiconductor device concurrently with the executing of the first test, process test data resulting from the first test, and execute the second test concurrently with the processing of the test data. In some variations, the device tester unit includes a plurality of hardware modules for testing the at least one mixed signal semiconductor device. In some embodiments, the apparatus includes at least one device interface unit coupled to the at least one processor and configured to provide signal interface for the at least one mixed signal semiconductor device. In some variations, the mixed signal semiconductor testing is performed by a single processor.

In some embodiments, the processor is configured to configure hardware elements corresponding to the first test in a mixed signal semiconductor device tester unit, and execute one or more test scripts corresponding to the first test. In some variations, the one or more test scripts include at least one command executable on the processor and in other variations, the mixed signal semiconductor device tester unit is coupled to the processor. In some embodiments, the processor is configured to identify hardware elements corresponding to the second test, and configure the hardware elements corresponding to the second test. In some variations, the first and the second tests are configured for one or more of wafer testing and package testing of the mixed signal semiconductor device. In some embodiments, the first and second tests are configured in an interpreted software language. In some variations, the interpreted software language is Interactive Test Pascal.

In some embodiments, the apparatus includes a first information storage coupled to the processor. In some variations, the processor is configured to store the test data resulting from the first test in the first information storage. In some embodiments, the first information storage is shared by a plurality of software computation modules concurrently executing on the processor. In some variations, the plurality of software computation modules are configured in at least one compiled software language. In some embodiments, the apparatus includes a second information storage coupled to the processor. In some variations, the processor is configured to store results of the processing of the test data in a second information storage. In some embodiments, the second information storage is shared by the plurality of software computation modules. In some variations, the first and second information storage are configured in a single storage unit.

The foregoing is a summary and shall not be used to limit the scope of the claims. The operations disclosed herein may be implemented in a number of ways, and such changes and modifications may be made without departing from this invention and its broader aspects. Other aspects, inventive features, and advantages of the present invention, as defined solely by the claims, are described in the non-limiting detailed description set forth below.

BRIEF DESCRIPTION OF THE DRAWINGS

FIG. 1 illustrates an example of a test system according to an embodiment of the present invention.

FIG. 2A illustrates an exemplary simplified configuration of a test system according to an embodiment of the present invention.

FIG. 2B illustrates an exemplary functionality of test system using various software modules according to an embodiment of the present invention.

FIG. 3 illustrates a flowchart of exemplary steps performed during a process of concurrently executing tests for a semiconductor device on a test system according to an embodiment of the present invention.

Figure 4:
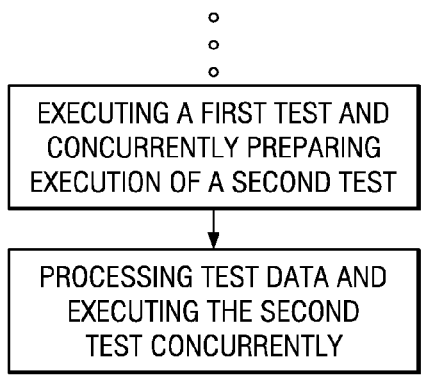
FIG. 4 illustrates a flowchart of exemplary steps performed during a process of testing a semiconductor device on a test system according to an embodiment of the present invention.
Figure 5:
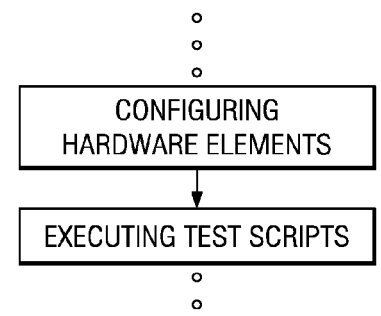
FIG. 5 illustrates a flowchart of exemplary steps performed during a process of testing a semiconductor device on a test system according to an embodiment of the present invention.
Figure 6:
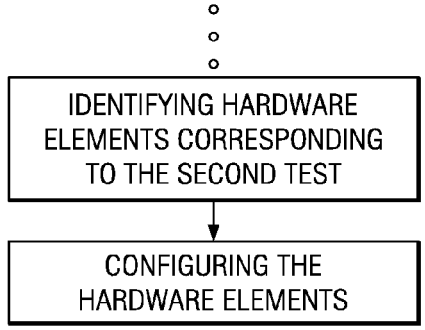
FIG. 6 illustrates a flowchart of exemplary steps performed during a process of testing a semiconductor device on a test system according to an embodiment of the present invention.
Figure 7:
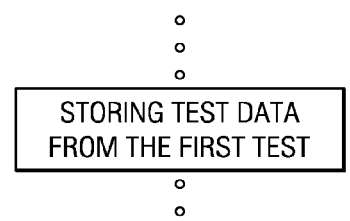
FIG. 7 illustrates a flowchart of exemplary a steps performed during a process of testing a semiconductor device on a test system according to an embodiment of the present invention.
Figure 8:
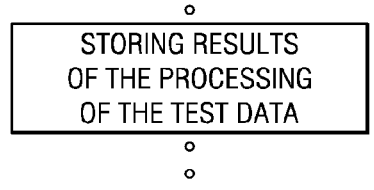
FIG. 8 illustrates a flowchart of exemplary a step performed during a process of testing a semiconductor device on a test system according to an embodiment of the present invention.

All of these drawings are drawings of certain embodiments. The scope of the claims is not to be limited to the specific embodiments illustrated in the drawings and described below.

DETAILED DESCRIPTION OF THE EMBODIMENTS

FIG. 1 illustrates an example of a test system 100 according to an embodiment of the present invention. System 100 includes 'n' control units 110. Control units 110 are configured as test systems to execute tests on semiconductor devices via various interface units. Control units can be any computer systems capable of executing test programs for the semiconductor devices (e.g., personal computers, SPARC based work stations or networked computers). Control units 110 are coupled via link 115 to 'n' Device Tester Units 120(1)-(n). The device tester units can be backplanes configured to host various test interface hardware modules (e.g., DMA interface modules, memory modules, processor modules, clock modules, power modules, or waveform generator modules). These various modules can be configured to provide desired test parameters for semiconductor device testing.

For purposes of illustration, in the present example, a combined link 115 is shown. Device testers 120(1)-(n) can, however, be coupled to control units 110(1)-(n) via various coupling mechanisms. For example, each control unit 110 can be directly coupled to a device tester unit 120 or the control units 110 can access the device tester units 120 via remote connections (e.g., dial-up connection, high-speed dedicated connection, closed loop server connection, broadband network connection, wireless communications and various other coupling mechanisms or combination thereof). Further, each control unit 110 can access each one of the device tester units 120 for various testing purposes.

The device tester units 120(1)-(n) are coupled via link 125 to 'n' device interface units 130(1)-(n). The device interface units 130 are coupled via link 135 to 'n' semiconductor devices under test 140(1)-(n). The device interface units 130 can be any interface mechanism configured to provide a signal interface with the device under test (e.g., pogo pin interface). The device under test can be in various development stages for testing purpose (e.g., wafer form, packaged form, or prototype). According to an embodiment, each device tester unit 120 can interface with any device under test 140 using corresponding device interface units 130. For example, control unit 110(1) can execute tests for the device under test 140(n) via the device tester unit 120(1) using device interface 130(n) or the like. While for purposes of illustration, individual units are shown and described, these units can be integrally configured. For example, each device tester unit 120 can be integrally configured to test more than one device under test 140, each control unit 110 can interface with multiple device tester units 120 to execute multiple tests on various devices under test 140 and the like. Similarly, control units 110 can be integrally configured to include device tester units 120 such as by forming an expansion card comprising both a control unit 110 and a device tester unit 120.

FIG. 2A illustrates a simplified configuration of a test system 200. System 200 includes a control unit 210. Control unit 210 can be any computing system (e.g., a SPARC™ based work station, or personal computer). Control unit 210 is coupled to a device tester unit 220. In the present example, the device tester unit 220 is configured as a backplane. The device tester unit can, however, be an integrated test unit and/or the device tester unit 220 can be an integrated test system installed in the control unit 210 or the like. The device tester units 220 are configured to include one or more of various test specific hardware modules (e.g., power modules, DMA modules, sub-clock modules, memory modules, execution modules, and wave generator modules) to generate appropriate test signals for semiconductor device testing. The device tester unit 220 is coupled via a device interface unit 230 to a device under test 240. The device under test 240 can be any semiconductor device (e.g., mixed signal integrated circuit, custom integrated circuit, general purpose processors and the like). The device under test 240 can be in any developmental stages (e.g., wafer stage, packaged stage, or prototype).

FIG. 2B illustrates an exemplary functionality of a test system using various software modules according to an embodiment of the present invention. Operating system 250 can be any operating system (e.g., WINDOWS™, UNIX™, LINUX™, or SOLARIS™) executing on a computing system (e.g., control unit 210). A tester user interface module 260 executes within the operating system 250 environment. The tester user interface 260 establishes software test environment for the device tester unit 240 within the operating system 250 to setup specific testing related parameters. A test program 265 executes within the tester user interface 260 environment. The test program 265 can be any test language script configured to test specific aspects of the device under test 240. For example, the test program 265 can include multiple tests for the device under test 240 where each test can provide given data to the device under test 240 to operate on and generate test results or the like. In an embodiment, the test program 265 is configured using interpreted language (e.g., Interactive Test Pascal).

The operating system 250 may execute 'n' computational modules 270(1)-(n). The computational modules 270s are configured to perform various computations on the test result data that is collected during the testing of the device under test. Each computational module can be configured to perform specific computations (e.g., FFT) on the test result data. A shared data storage 275 is used by various software modules to share and exchange data. For purposes of illustrations, in the present example, the data storage 275 is configured under the operating system 250 in the control unit 210. The data storage 275 can, however, be configured in any system element. For example, in a networked environment, the data storage 275 can be configured in networked data storage, residing in various network elements or the like. Further, the data storage 275 can be any data storage (e.g., system memory, local memory, or external storage). The data storage 275 can be pre-allocated or dynamically allocated data storage.

Initially, tester user interface 260 establishes a test environment for the test program 265. The test program 265 can be any user programmed test code to be executed on the device under test 240 to collect test specific data. The test program 265 can include various test scripts that are executed on the device under test 240. Each test within the test program 265 can collect test specific data that can be used for computation purpose to determine corresponding functionality of the device under test 240. Conventionally, when the test program 265 is executed in the tester user interface 260 environment, the test program 265 sets up the test specific hardware modules in the device tester unit 220 and executes the tests. Once the test program 265 is initiated, the tester user interface 260 transfers the control of tester unit to the test program 265 and the control is not returned back to the tester user interface 260 until the test program 265 completes the test execution. Typically, the test program 265 sets hardware modules in the device tester unit 220 for a first test, executes the first test, performs appropriate computations on the data collected by the first test, evaluates the results of the first test and then sets the hardware modules for the next test. Generally, these steps are performed serially.

The data collected from the testing of certain types of device under test (e.g., mixed signal integrated circuits) require complicated mathematical computations (e.g., FFT). Because typically the test program 265 is based on interpreted language (e.g., Interactive Test Pascal), it requires significant amount of time to perform computations on the test data for a first test before the next test can be initiated. Many of the hardware modules of the device tester unit 220 remain idle during test execution, data acquisition and data computation. Because conventionally the test program 265 performs each step serially, the idle time of various hardware modules remains unused.

According to an embodiment, the computational aspect of the testing is separated from the test program 265. Individual computation modules, such as the computational modules 270, are configured to perform intensive computations independently on the test data, thus reducing the amount of time required to execute the test program 265. Further, these computation modules are configured using structured compiled languages (e.g., 'C', or 'C++') which expedites the execution of complicated mathematical computation. The tester user interface 260 provides an interface for the test program 265 to access computational modules. For example, during the execution of a test, if the test program 265 requires performing an FFT on the data collected by the test, the test program 265 can access a specific computational module to perform FFT on the test data, and the test program 265 can wait for the computations to be completed. Various inter-process interfaces can, however, be configured for data exchange between the processes (e.g., polling various parameters, sending 'wakeup calls' to processes, or generating process interrupts). After the initiation of a test session, the tester user interface 260 may releases the control of the device tester unit 220 back to the test program 265 which enables the test program 265 to utilize idle hardware time of the hardware modules that are not used during the execution of the current test.

For example, when a first test is executed by the test program 265, the first test may utilize certain hardware modules in the device tester unit 220 (e.g., clock module, or DMA module). While the first test is executing in the device tester unit 220, the test program 265 can perform various tasks on the hardware elements that are not used by the first test. For example, the test program 265 can verify some of the analog channels used for the device power and the like. These analog channels can be located in the device tester unit 220. In other cases, while the first test is executing, the test program 265 can make measurements on certain pins of the device under test 240. Thus, various idle elements of different modules in the device tester unit 220 can be used concurrently with the device testing.

Conventionally, the test program 265 performs serial computations on the test data. According to an embodiment, once the test program 265 identifies the types of computations to be performed on the test data, the test program 265 may initiate and execute appropriate computational modules concurrently on the same test data using the data storage 275 to facilitate parallel execution. The tester user interface 260 is configured to collect the test data and store the test data in the data storage 275 upon receiving instructions from the test program 265. The test program 265 initiates appropriate computation modules to perform computations on the test data. Each computation module can access the test data from the data storage 275 and perform respective computation on the test data. The data storage 275 can be further configured to provide storage for the results of these computations. For example, if there are four computation modules executing on a given test data, then the data storage 275 can be configured to provide one input storage for the test data and four output storages to store the results of the computation modules. Similarly, the data storage 275 can, however, be configured to provide storage for multiple test data and corresponding computation results.

FIG. 3 illustrates a flowchart of exemplary steps performed during a process of concurrently executing tests for a semiconductor device on a test system according to some embodiments of the present invention. For purposes of illustrations, in the present example, various steps are described in particular order however, when supported by accompanying hardware and software, these steps can be performed in any order, serially or in parallel.

Initially, the process sets the test environment (310). Setting up the test environment may include executing a test program within a tester user interface on a host computer environment (e.g., SPARC based work station, or personal computer). The tester user interface module provides the interface between the test program and the device tester. The test program can be implemented in any software language. According to some embodiments, the test program is implemented in interpreted language (e.g., Interactive Test Pascal). The test program provides users control over each step of device testing. The process sets the test parameters on the device tester for a first test identified by the test program (320). Conventionally, when a test program is executed, the tester user interface programs the hardware modules as directed by the test program as necessary to perform appropriate tests (e.g., clock speed, waveform shapes, or sample computations) and executes the tests serially.

After setting the parameters for the first test, the process executes the first test (330). While the first test is being executed, the process determines whether the test program requires additional tests (340). A test program can include a sequence of tests to be executed on a device under test. Each test can determine various functional aspects of the device under test using single command execution or a combination of various commands using a given set of data. During the execution of the first test, various hardware elements in the device tester can remain idle. For example, a sub-clock unit in the device tester may be utilized to generate a given clock speed however, remaining sub-units for generating different clock speeds in the sub-clock unit may remain idle. Further, the device tester can include various waveform generators and some of the waveform generators may not be used for the first test. Similarly, the device tester can include various other test elements that remain idle during the execution of the first test.

These idle elements can be used by other tests that follow the first test that is being executed in the device tester. However, if the test user interface retains the control of the device tester, the test program cannot access these idle elements and the tests will be executed serially by the test program. According to some embodiment, the tester user interface returns the control to the test program and the test program waits for the results of the first test that is being executed. There are various mechanisms by which the test program may wait (e.g., executing specific wait command, putting the process to 'sleep', randomly or periodically polling given parameter and/or states).

If the process determines that the test program includes additional tests, the process sets the parameters for the next test in the device tester (350). The setting of parameters for the next test can include identifying corresponding hardware elements in the device tester that are needed for the next test, determine whether the required hardware elements remain idle during the test currently being executed in the device tester, setting up various hardware modules as required by test program and the like. The process determines whether the resultant data from the test currently being executed in the device tester is ready (360). If the resultant data is not available, then the process waits until the data from the current test is available. The process can be configured to perform various tasks while waiting for the data to become available (e.g., setting the environment for the next test, preparing the execution of computation routines, preparing the data storage, or transferring the partial data collected by the current test).

When the data from the current test is available, the process forwards the data for computation (370). The process determines whether the current test was the last test identified by the test program (380). If the current test was not the last test, the process proceeds to execute the next test for which the parameters were previously set (330). If the process was unable to set the parameters for the next test in 350 (e.g., common hardware elements used between the current and the next test), the process sets the parameters for the next test before executing the next test. The operations discussed herein may consist of directly entered commands by a computer system user or by steps executed by application specific hardware modules. The functionality of steps referred to herein may correspond to the functionality of modules or portions of modules.

The operations referred to herein may be modules or portions of modules (e.g., software, firmware or hardware modules). For example, although the described embodiment includes software modules and/or includes manually entered user commands, the various exemplary modules may be application specific hardware modules. The software modules discussed herein may include script, batch or other executable files, or combinations and/or portions of such files. The software modules may include a computer program or subroutines thereof-encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into sub-modules to be executed as multiple computer processes. Moreover, alternative embodiments may combine multiple instances of a particular module or sub-module. Furthermore, those skilled in the art will recognize that the operations described in exemplary embodiment are for illustration only. Operations may be combined or the functionality of the operations may be distributed in additional operations in accordance with the invention.

A few preferred embodiments have been described in detail hereinabove. It is to be understood that the scope of the invention also comprehends embodiments different from those described, yet within the scope of the claims. Words of inclusion are to be interpreted as nonexhaustive in considering the scope of the invention. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

The section headings in this application are provided for consistency with the parts of an application suggested under 37 CFR 1.77 or otherwise to provide organizational cues. These headings shall not limit or characterize the invention(s) set out in any patent claims that may issue from this application. Specifically and by way of example, although the headings refer to a "Field of the Invention," the claims should not be limited by the language chosen under this heading to describe the so-called field of the invention. Further, a description of a technology in the "Description of Related Art" is not be construed as an admission that technology is prior art to the present application. Neither is the "Summary of the Invention" to be considered as a characterization of the invention(s) set forth in the claims to this application. Further, the reference in these headings, or elsewhere in this document, to "Invention" in the singular should not be used to argue that there is a single point of novelty claimed in this application. Multiple inventions may be set forth according to the limitations of the multiple claims associated with this patent specification, and the claims accordingly define the invention(s) that are protected thereby. In all instances, the scope of the claims shall be considered on their own merits in light of the specification but should not be constrained by the headings included in this application.

While particular embodiments of the present invention have been shown and described, it will be clear to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims.

What is claimed is:

1. A method of testing at least one mixed signal semiconductor device, the method comprising:
   executing a first test for the at least one mixed signal semiconductor device;
   preparing execution of a second test for the at least one mixed signal semiconductor device concurrently with the executing of the first test;
   processing test data resulting from the first test; and
   executing the second test concurrently with the processing of the test data;
   wherein the mixed signal semiconductor testing is performed by a single processor.

2. The method according to claim 1, wherein the executing the first test comprises:
   configuring hardware elements corresponding to the first test in a mixed signal semiconductor device tester unit; and
   executing one or more test scripts corresponding to the first test, wherein the one or more test scripts include at least one command executable on the processor and the mixed signal semiconductor device tester unit is coupled to the processor.

3. The method according to claim 1, wherein the preparing execution of the second test comprises:
   identifying hardware elements corresponding to the second test; and
   configuring the hardware elements corresponding to the second test.

4. The method according to claim 1, wherein the first and the second tests are configured for one or more of wafer testing and package testing of the mixed signal semiconductor device.

5. The method according to claim 1, wherein the first and second tests are configured in an interpreted software language.

6. The method according to claim 5, wherein the interpreted software language is Interactive Test Pascal.

7. The method according to claim 1, further comprising:
   storing the test data resulting from the first test in a first information storage, wherein the first information storage is shared by a plurality of software computation modules concurrently executing on the processor.

8. The method according to claim 7, wherein the plurality of software computation modules are configured in at least one compiled software language.

9. The method according to claim 7, further comprising:
   storing results of the processing of the test data in a second information storage, wherein the second information storage is shared by the plurality of software computation modules.

10. The method according to claim 9, wherein the first and second information storage are configured in a single storage unit.

11. An apparatus for testing at least one mixed signal semiconductor device comprising:
    a device interface unit adapted to communicate with a device under test;
    a device testing unit adapted to communicate with the device interface unit and a control unit;
    the control unit including at least one processor, an operating system, and computational modules;
    wherein the processor is configured to:
       execute a first test for the at least one mixed signal semiconductor device;
       prepare execution of a second test for the at least one mixed signal semiconductor device concurrently with the executing of the first test; and
       execute the second test; and
    wherein the computational modules are configured to process the test data from the first test concurrently with the processor executing the second test.

12. The apparatus according to claim 11, wherein the device tester unit comprises a plurality of hardware modules for testing the at least one mixed signal semiconductor device.

13. The apparatus according to claim 11, wherein the processor is further configured to configure hardware elements corresponding to the first test in the mixed signal semiconductor device tester unit; and to execute one or more test scripts corresponding to the first test, wherein the one or more test scripts include at least one command executable on the processor and the mixed signal semiconductor device tester unit is coupled to the processor.

14. The apparatus according to claim 11, wherein the processor is further configured to identify hardware elements corresponding to the second test; and configure the hardware elements corresponding to the second test.

15. The apparatus according to claim 11, further comprising:
    a first information storage coupled to the processor, wherein the processor is further configured to store the test data resulting from the first test in the first information storage, wherein the first information storage is shared by a plurality of software computation modules concurrently executing on the processor.

16. The apparatus according to claim 15, wherein the plurality of software computation modules are configured in at least one compiled software language.

17. The apparatus according to claim 15, further comprising:
    a second information storage coupled to the processor, wherein the processor is further configured to store results of the processing of the test data in a second information storage, wherein the second information storage is shared by the plurality of software computation modules.

18. The apparatus according to claim 17, wherein the first and second information storage are configured in a single storage unit.

* * * * *

UNITED STATES PATENT AND TRADEMARK OFFICE
CERTIFICATE OF CORRECTION

| | | |
|---|---|---|
| PATENT NO. | : 7,587,642 B2 | Page 1 of 1 |
| APPLICATION NO. | : 10/614997 | |
| DATED | : September 8, 2009 | |
| INVENTOR(S) | : Burke, Jr. et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1551 days.

Signed and Sealed this

Twenty-first Day of September, 2010

David J. Kappos
*Director of the United States Patent and Trademark Office*